(12) United States Patent
Choi et al.

(10) Patent No.: US 10,824,256 B2
(45) Date of Patent: Nov. 3, 2020

(54) FLEXIBLE DISPLAY AND METHOD OF MANUFACTURING THE SAME

(71) Applicant: LG DISPLAY CO., LTD., Seoul (KR)

(72) Inventors: Nack-Bong Choi, Goyang-si (KR); Mi-Seong Kim, Bucheon-si (KR)

(73) Assignee: LG DISPLAY CO., LTD., Seoul (KR)

( * ) Notice: Subject to any disclaimer, the term of this patent is extended or adjusted under 35 U.S.C. 154(b) by 571 days.

(21) Appl. No.: 15/332,502

(22) Filed: Oct. 24, 2016

(65) Prior Publication Data

US 2017/0123543 A1 May 4, 2017

(30) Foreign Application Priority Data

Oct. 30, 2015 (KR) .................. 10-2015-0152458

(51) Int. Cl.
*G06F 3/041* (2006.01)
*H01L 27/32* (2006.01)
*H01L 51/00* (2006.01)

(52) U.S. Cl.
CPC .......... *G06F 3/0412* (2013.01); *G06F 3/0416* (2013.01); *H01L 27/323* (2013.01); *G06F 2203/04102* (2013.01); *G06F 2203/04103* (2013.01); *G06F 2203/04107* (2013.01); *H01L 27/3276* (2013.01); *H01L 51/0097* (2013.01); *H01L 2227/323* (2013.01); *H01L 2251/5338* (2013.01)

(58) Field of Classification Search
CPC ................. G06F 3/0412; G06F 3/0416; G06F 2203/04103; G06F 3/04; G06F 3/041; H01L 27/323; H01L 27/3276; H01L 51/0097; H01L 2227/323; H01L 2251/5338
See application file for complete search history.

(56) References Cited

U.S. PATENT DOCUMENTS

| 2011/0095277 | A1* | 4/2011 | Beierlein | H01L 51/5203 257/40 |
| 2013/0147727 | A1* | 6/2013 | Lee | G06F 3/0412 345/173 |
| 2014/0049449 | A1* | 2/2014 | Park | G09G 5/00 345/1.3 |
| 2014/0061597 | A1* | 3/2014 | Choi | H01L 51/5284 257/40 |
| 2014/0062909 | A1* | 3/2014 | Choi | G09G 3/32 345/173 |

(Continued)

FOREIGN PATENT DOCUMENTS

| CN | 102096221 A | 6/2011 |
| CN | 103594483 A | 2/2014 |

(Continued)

*Primary Examiner* — Lunyi Lao
*Assistant Examiner* — Jarurat Suteerawongsa
(74) *Attorney, Agent, or Firm* — Dentons US LLP

(57) ABSTRACT

A flexible display device includes a touch electrode array including a buffer layer with a through hole in the buffer layer, a touch pad metal electrode in the through hole, a plurality of touch patterns on the buffer layer, and a flexible printed circuit contacting the touch pad electrode. Optionally, the flexible printed circuit can also contact a thin-film transistor pad on an organic light emitting array substrate laminated to the touch electrode array.

19 Claims, 15 Drawing Sheets

(56) References Cited

U.S. PATENT DOCUMENTS

| | | | | |
|---|---|---|---|---|
| 2014/0111709 A1* | 4/2014 | Kim | ................... | G02F 1/13338 |
| | | | | 349/12 |
| 2014/0132861 A1* | 5/2014 | Wang | ..................... | G06F 3/044 |
| | | | | 349/12 |
| 2015/0185942 A1 | 7/2015 | Kim et al. | | |
| 2017/0102806 A1* | 4/2017 | Chang | ................... | G06F 3/0412 |

FOREIGN PATENT DOCUMENTS

| | | |
|---|---|---|
| CN | 104882404 A | 9/2015 |
| DE | 102010042473 A1 | 6/2011 |
| GB | 2476139 A | 6/2011 |

* cited by examiner

FLEXIBLE DISPLAY AND METHOD OF MANUFACTURING THE SAME

CROSS REFERENCE TO RELATED APPLICATIONS

This application claims the benefit of Korean Patent Application No. 10-2015-0152458, filed on Oct. 30, 2015, which is hereby incorporated by reference for all purposes as if fully set forth herein.

BACKGROUND

Field of the Disclosure

The present disclosure relates to a display device and a method of manufacturing the same. More particularly, the disclosure relates to a flexible display configured such that a pad electrode of a touch electrode array is routed outside of the flexible display, and the pad electrode is directly bonded to a flexible printed circuit (FPC) outside of the flexible display. Thereby, the occurrence of bonding stress is prevented.

Discussion of the Related Art

Examples of flat display devices include a liquid crystal display (LCD), an organic light emitting display, a plasma display panel (PDP), a quantum dot display, a field emission display (FED), and an electrophoretic display (EPD). These displays commonly require a flat display panel on which an image is displayed. Such a flat display panel includes a pair of transparent insulated substrates coupled to each other with an inherent luminous material, polarizing material, or another optical material layer is disposed therebetween.

In recent years, there has been increasing demand for flat display panels to minimize space to offset the increasing overall size of the display devices. Furthermore, flexible flat display devices have been desired.

Hereinafter, a related are flexible display will be described with reference to the drawings.

FIG. 1 is a sectional view showing a flexible display of the related art.

As shown in FIG. 1, the flexible display of the related art includes a film substrate 1, a first adhesive layer 5, a lower base film 10, a buffer layer 15, a thin film transistor array 20, an organic light emitting diode array 30, a passivation layer 40 formed so as to cover the organic light emitting diode array 30, a second adhesive layer 50, a touch electrode array 70, and an upper base film 60, which are sequentially oriented from bottom to top.

The flexible display of the related art is formed as follows. The buffer layer 15, the thin film transistor array 20, the organic light emitting diode array 30, and the passivation layer 40 are formed on the lower base film 10. The touch electrode array 70 is formed on the surface of the upper base film 60. The passivation layer 40 and the touch electrode array 70 are laminated in a state in which the second adhesive layer 50 is between the passivation layer 40 and the touch electrode array 70.

Because the touch electrode array 70 is formed inside the upper base film 60, a touch pad electrode 70a is formed on the surface of the upper base film 60, which is located on the same layer as the touch electrode array 70. The touch pad electrode 70a is electrically connected to an auxiliary pad electrode 20a, which is located below the touch pad electrode 70a and formed through the same process as the thin film transistor array 20, via an anisotropic conductive film (ACF) 82 including a conductive ball (not shown). The auxiliary pad electrode 20a is connected to a flexible printed circuit (not shown), from which a signal is applied to the auxiliary pad electrode 20a.

In addition to the conductive ball, the anisotropic conductive film 82 may be filled with a sealant 81 exhibiting a high adhesive property.

In addition, the film substrate 1 is adhered to the lower base film 10 via the first adhesive layer 5. The film substrate 1 serves to protect the flexible display after the upper base film 60 and the lower base film 10 are laminated.

In the method of manufacturing the flexible display of the related art, a press-cure process for rupturing the conductive ball in the anisotropic conductive film 82 is performed in order to interconnect the touch pad electrode 70a and the auxiliary pad electrode 20a. In this process, high pressure is required. In a case in which the upper and lower base films 60 and 10 are made of soft plastic films, i.e. flexible plastic films, the upper and lower base films 60 and 10 may be deformed depending upon the pressure used. The high pressure causes deformation in the films with the electronic structures and leads to defects in the display. Also, the high pressure is applied to entire surfaces of the upper and lower base films 60 and 10 because the anisotropic conductive film 82 is between the upper and lower base films 60 and 10. According, as a flexible display becomes a large size, a bigger apparatus is required to apply uniform heat and pressure between the upper and lower base films 60 and 10. Therefore, in the related art, there is a limit in the process capability and apparatus during the bonding process.

In particular, with the goals of increasing display flexibility and thinness, the thickness of the base films 10 and 60 continues to decrease. When thin base films are used, however, the base films on conductive connection members have low resistance in the press-cure process, thereby reducing yield and decreasing manufacturing efficiency.

SUMMARY

Accordingly, the present invention is directed to a flexible display and a method of manufacturing the same that substantially obviate one or more problems due to limitations and disadvantages of the related art.

An advantage of the present invention is to provide a flexible display and a method of manufacturing the same configured such that a pad electrode of a touch electrode array is exposed to the outside of the flexible display, and the pad electrode is directly bonded to a flexible printed circuit (FPC) outside of the flexible display. Thereby eliminating the occurrence of bonding stress.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

An exemplary embodiment of the invention includes a flexible display device comprising an organic light emitting display unit, an adhesive layer on the organic light emitting display unit, a touch electrode array on the adhesive layer, a buffer layer on the touch electrode array, the buffer layer including a through hole in the buffer layer, a touch pad electrode in the through hole, exposed on a first surface of the buffer layer; and a flexible printed circuit contacting the touch pad electrode.

A method of manufacturing a flexible display device, includes providing a glass substrate, forming a buffer layer on the glass substrate, patterning a through hole in the buffer layer, forming a touch pad electrode in the through hole, forming a touch electrode array on the buffer layer, providing an organic light emitting display unit, laminating the organic light emitting display unit and the touch electrode array in a state in which an adhesive layer is disposed therebetween, removing the glass substrate to expose the touch pad electrode on a first surface of the buffer layer and connecting a flexible printed circuit to the exposed touch pad electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Reference will now be made in detail to embodiments of the present invention, examples of which are illustrated in the accompanying drawings. Wherever possible, the same reference numbers will be used throughout the drawings to refer to the same or like parts. In the following description of the embodied invention, a detailed description of known functions and configurations incorporated herein will be omitted when it may obscure the subject matter. In addition, the terms used in the following description are selected in consideration of the ease of preparation of the specification, and may be different from the names of parts constituting a real product.

Figure 1:
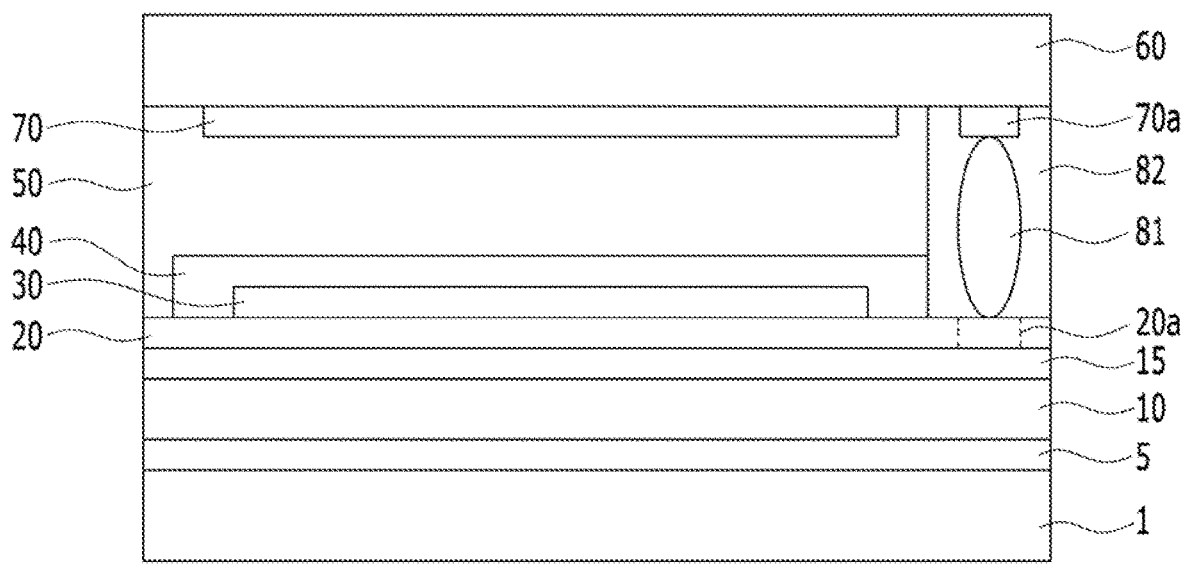
FIG. 1 is a sectional view showing a flexible display of a related art.
Figure 2:
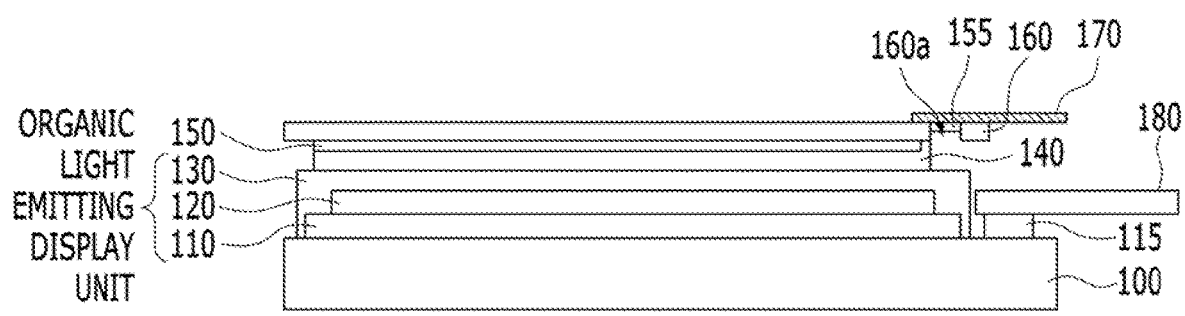
FIG. 2 is a sectional view schematically showing a flexible display according to the disclosed embodiments.
Figure 3:
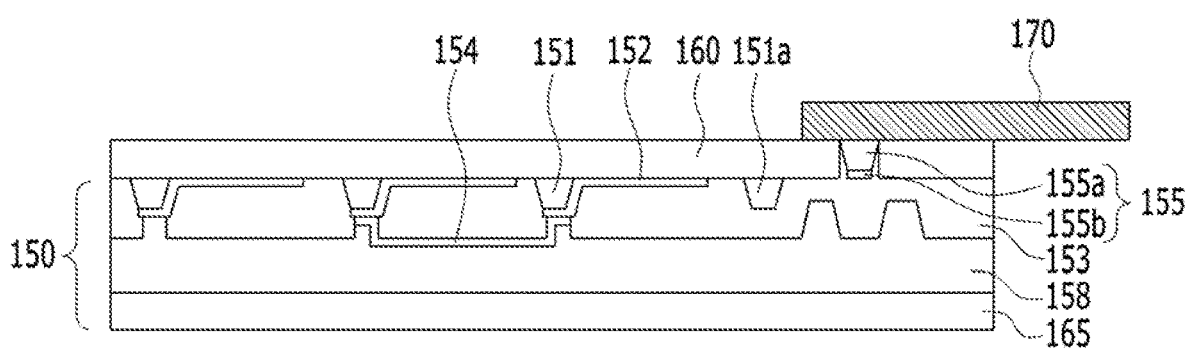
FIG. 3 is a sectional view showing a touch electrode array of FIG. 2 and bonding between a touch pad electrode of the touch electrode array and a flexible printed circuit (FPC)

FIG. 2 is a sectional view schematically showing a flexible display according to the disclosed embodiments, and FIG. 3 is a sectional view showing a touch electrode array of FIG. 2 and bonding between a touch pad electrode of the touch electrode array and a flexible printed circuit (FPC).

As shown in FIGS. 2 and 3, the flexible display may include an organic light emitting display unit formed on a base film 100. The organic light emitting display unit includes a thin film transistor (TFT) array 110, an organic light emitting diode array 120 connected to the thin film transistor array 110, and an encapsulation layer 130 formed to cover the organic light emitting diode array 120. The flexible display further includes a buffer layer 160, a touch electrode array 150, a touch pad electrode 155 exposed from the buffer layer 160, an adhesive 140, and a touch flexible printed circuit 170 connected to the touch pad electrode 155.

In the organic light emitting display unit, a TFT pad electrode 115 is on the same layer as the thin film transistor array 110. The TFT pad electrode 115 is connected to a flexible printed circuit 180 for controlling the organic light emitting display unit.

As shown, the flexible printed circuit 180 is formed separately from the touch flexible printed circuit 170. Alternatively, the flexible printed circuit 180 may be integrally formed with the touch flexible printed circuit 170 (see reference numeral 200 in FIGS. 5A and 5B).

The organic light emitting display unit and the buffer layer 160, which has the touch electrode array 150, are laminated in a state in which the adhesive layer 140 is in between. Before lamination, the organic light emitting display unit and the buffer layer 160 are formed on base films or glass.

FIG. 3 shows the touch flexible printed circuit 170 directly connected to the touch pad electrode 155 on a first surface (an upper surface, in FIG. 3) of the buffer layer 160. As shown, the touch flexible printed circuit 170 may be provided to drive only the touch electrode array 150. Alternatively, the touch flexible printed circuit 170 may be connected to the organic light emitting display unit to simultaneously drive the organic light emitting display unit and the touch electrode array 150, which will be described hereinafter.

The touch pad electrode 155 includes a metal layer 155*a* and a transparent electrode layer 155*b* formed on the metal layer 155*a*. That is, the touch pad electrode 155 has a double-layer structure. The metal layer 155*a* and the transparent electrode layer 155*b* are formed through the same processes as a metal mesh layer 151, with routing wires 151*a*, and touch patterns 152 in the touch electrode array 150.

It should be noted that a through hole 160*a* is formed in the buffer layer 160. The outermost side of the touch pad electrode 155 is exposed through the through hole 160*a* in order to directly connect (bond) the touch pad electrode 155 to the touch flexible printed circuit 170 with a conductive adhesive (not shown) on only a portion of the first surface of the buffer layer 160. For an example, the conducive adhesive may be an anisotropic conductive film or silver (Ag) dot. In this case, because the conductive adhesive is on the outer surface (the first surface) of the buffer layer 160, there is no need to apply pressure on an entire surface of the buffer layer 160. That is, bonding using the conductive adhesive between the touch pad electrode 155 and the touch flexible printed circuit 170 is locally processed on a region corresponding only to the touch pad electrode 155. As a result, no apparatus is required to uniformly apply heat and pressure between two base films or glass substrates, and a pressurization process for the entire surface of the buffer layer 160 may be omitted. Consequently, the touch flexible printed circuit 170 may flatly contact on the outmost surface of the touch pad electrode 155 and the first surface of the buffer layer 160 without a difference between the outmost surface of the touch pad electrode 155 and the first surface of the buffer layer 160.

Specifically, the touch electrode array 150 includes a metal mesh layer 151, a plurality of touch patterns 152 connected to the metal mesh layer 151, an interlayer dielectric 153 formed so as to cover the touch patterns 152 while partially exposing the touch patterns 152 on the metal mesh layer 151, a bridge pattern 154 formed on the interlayer dielectric 153 between ones of the touch patterns that are adjacent to each other in a first direction, and a passivation film 158 formed so as to cover the bridge pattern 154, all of which are formed on a second surface (a lower surface in FIG. 3) of the buffer layer 160.

The metal mesh layer 151, which is made of shielding metal, such as molybdenum, exhibiting high conductivity, is connected to the lower sides of the touch patterns 152, which are made of a transparent electrode material, such as indium tin oxide (ITO), to reduce the resistance of the touch patterns 152. While the metal mesh layer 151 is formed, routing wires 151a, each of which is located at the end of a corresponding one of the touch patterns 152, which will be formed after the formation of the metal mesh layer 151, are also formed.

The metal layer 155a of the touch pad electrode 155 may be made of the same material as the metal mesh layer 151, and may be located in the through hole 160a.

A barrier layer 165 may be further provided between the adhesive layer 140 and the touch electrode array 150. In the flexible display, the touch flexible printed circuit 170 covers the through hole 160a formed in the buffer layer 160, with the result that no additional layer is formed on the first surface (the upper surface) of the buffer layer 160. For this reason, the barrier layer 165 is located on the surface of the touch electrode array 150 that is inside the panel to protect the through hole.

The thin film transistor array 110 may evenly extend wider than the touch electrode array 150. The TFT pad electrode 115 is provided at the protruding thin film transistor array 110, and the flexible printed circuit 180 is connected to the TFT pad electrode 115.

The buffer layer 160 may be an organic layer having a thickness of 0.1 μm to 8 μm. For example, the buffer layer 160 may be made of photo acryl copolymer (PAC). In this case, the flexible display according to the embodiment may include only the buffer layer 160, in which the touch electrode array 150 is located, for preventing the touch electrode array 150 from being exposed to outside air or moisture without using an additional base film for protection. Consequently, it is possible to greatly reduce the thickness of the flexible display. Preferably, the thickness of the buffer layer 160 may be 1 μm to 5 μm.

In a case in which the thickness of the buffer layer 160 is very thin, the buffer layer 160 may be curved or differently affected during the formation of the touch electrode array 150. In order to solve this problem, a sacrificial layer 310 (see FIG. 7A) and a glass substrate 300 (see FIG. 7A) are further provided on the first surface of the buffer layer 160 in the actual forming process. In this case, the glass substrate 300 and the sacrificial layer 310 are removed by scribing or laser ablation after the touch electrode array 150 and the organic light emitting display unit are laminated, as will be further described below.

Figure 4A:
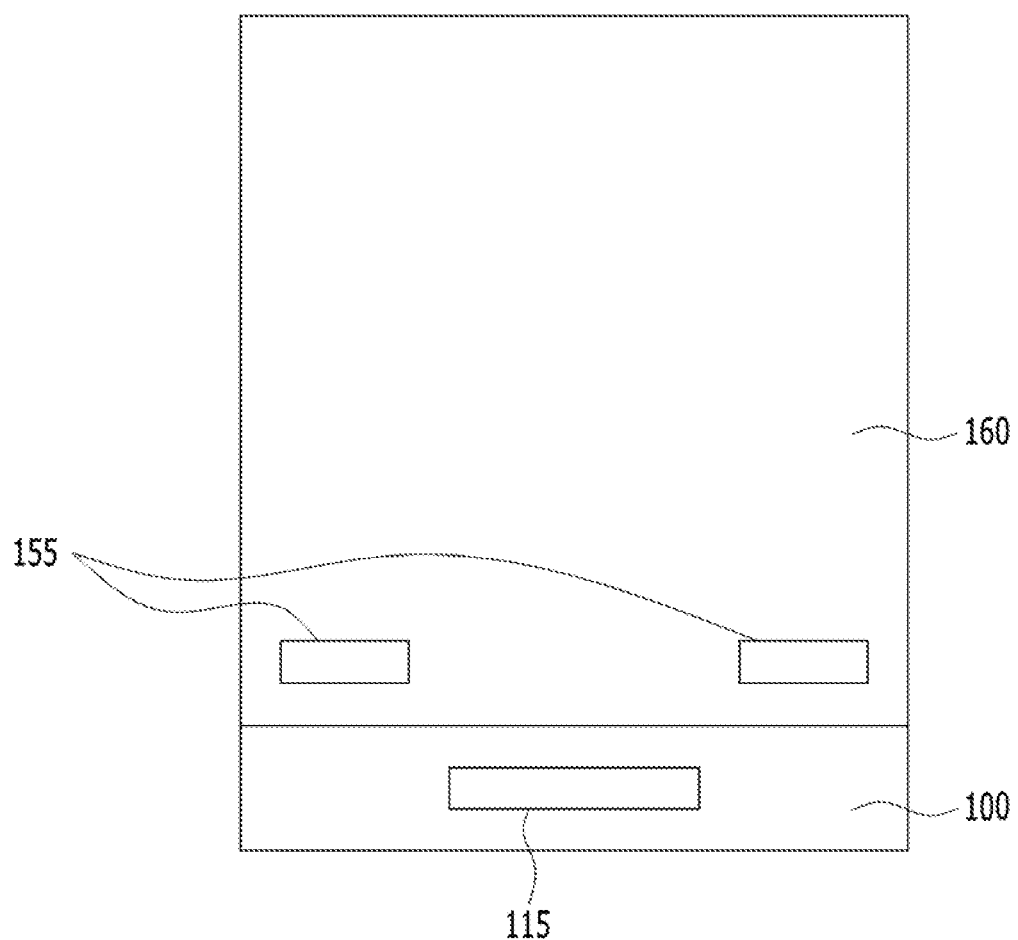
FIG. 4A is a plan view showing a touch pad electrode and a TFT pad electrode in a first exemplary embodiment of the flexible display according to the present invention.
Figure 4B:
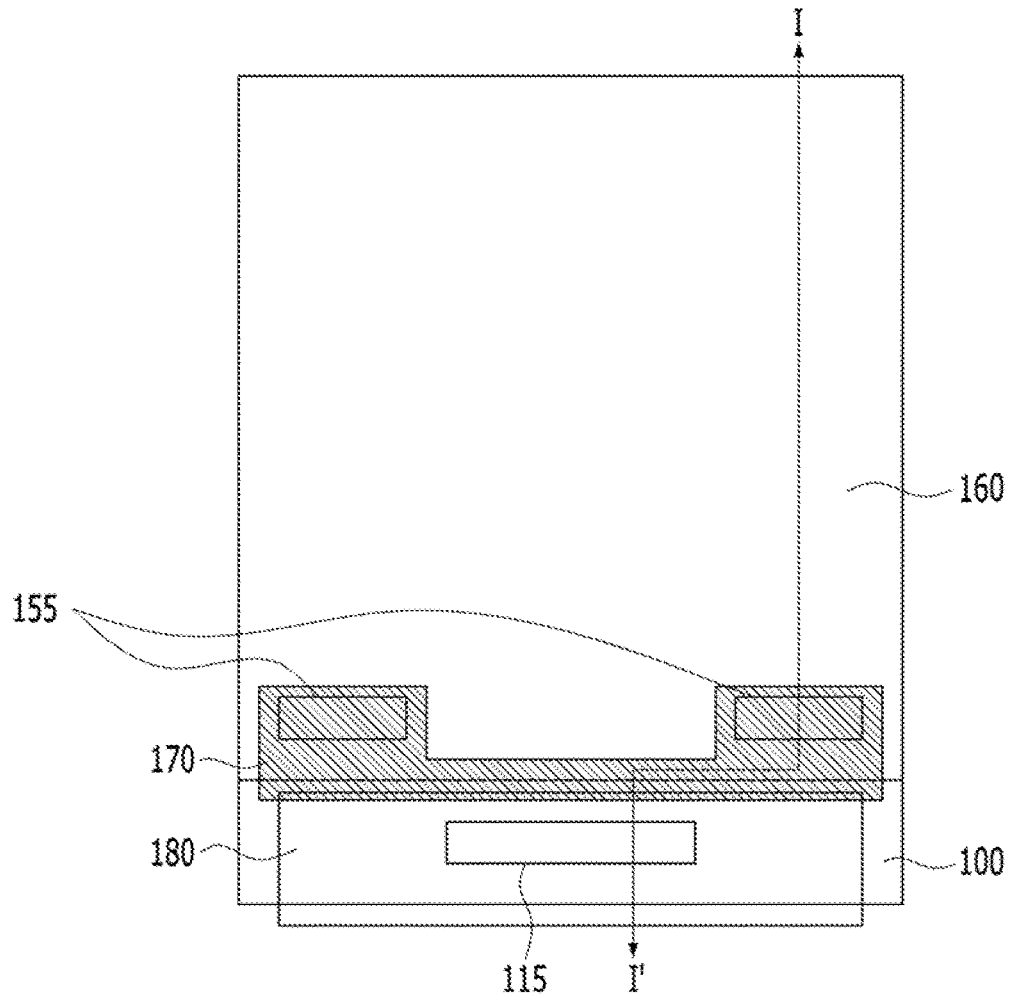
FIG. 4B is a plan view showing an FPC connected to the pad electrodes of FIG. 4A.
Figure 4C:
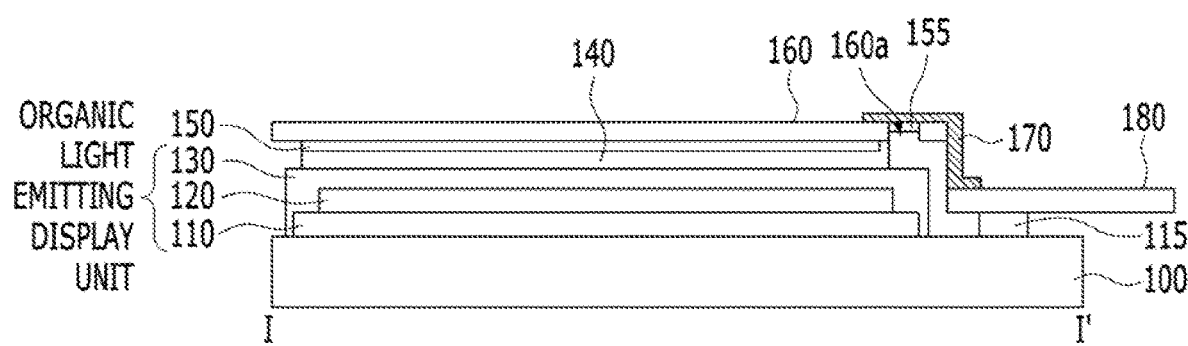
FIG. 4C is a sectional view of line I-I' of FIG. 4B.

FIG. 4A is a plan view showing a touch pad electrode and a TFT pad electrode in a first exemplary embodiment, FIG. 4B is a plan view showing an FPC connected to the pad electrodes of FIG. 4A, and FIG. 4C is a sectional view of line I~I' of FIG. 4B.

As shown in FIGS. 4A~4C, the base film 100 including a thin film transistor array (the reference '110' shown in FIG. 2) may evenly extend wider than the buffer layer 160 including touch electrode array (the reference '150' shown in FIG. 2). The TFT pad electrode 115 is provided at the extending base film 100, and the TFT pad electrode 115 is connected to the flexible printed circuit 180. Also, the touch pad electrodes 155 is connected to the touch flexible printed circuit 170.

As shown in FIG. 4C, a part of the touch flexible printed circuit 170 may have an electrical and physical connection with the flexible printed circuit 180. In some cases, the connection part between the touch flexible printed circuit 170 and the flexible printed circuit 180 may be located on a lower surface of the flexible printed circuit 180.

Figure 5A:
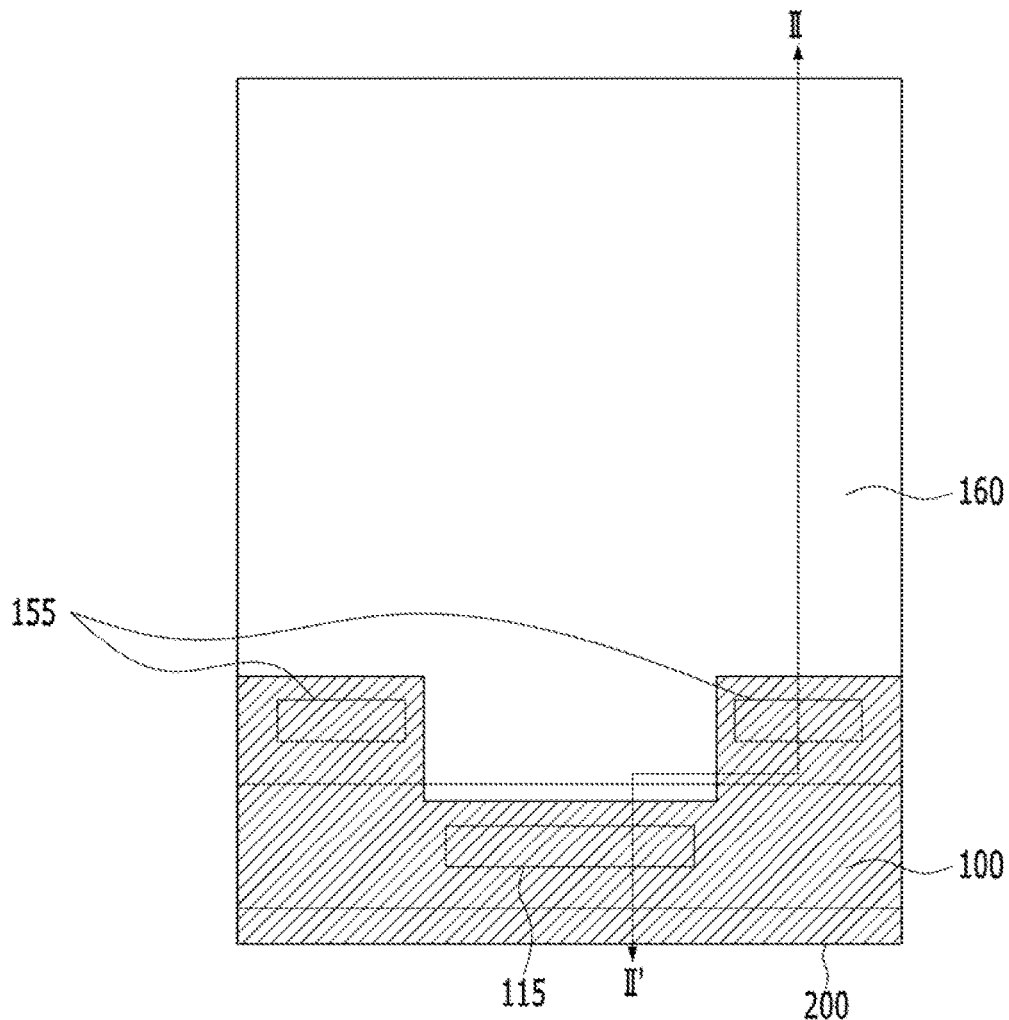
FIG. 5A is a plan view showing an FPC connected to the pad electrodes of FIG. 4A in a modification of the first exemplary embodiment of the flexible display according to the present invention.
Figure 5B:
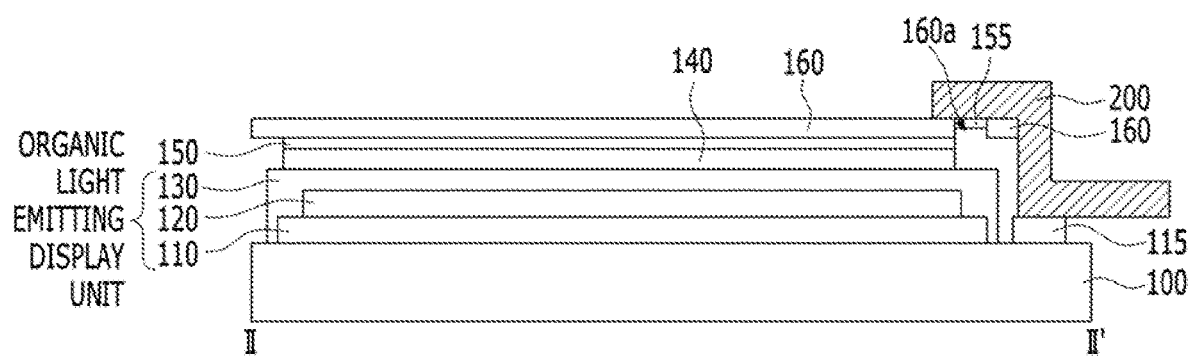
FIG. 5B is a sectional view of line II~II' of FIG. 5A.

FIG. 5A is a plan view showing an FPC connected to the pad electrodes of FIG. 4A in a modification of the first exemplary embodiment of the flexible display according to the present invention. FIG. 5B is a sectional view of line II~II' of FIG. 5A.

In a modification of the first exemplary embodiment of the flexible display according to the present invention, as shown in FIGS. 5A and 5B, the base film 100 including a thin film transistor array (the reference '110' shown in FIG. 2) may evenly extend wider than the buffer layer 160 including touch electrode array (the reference '150' shown in FIG. 2). The TFT pad electrode 115 is provided at the base film 100, and a flexible printed circuit 200 may be commonly connected to the touch pad electrodes 155 and the TFT pad electrode 115.

In this case, the TFT pad electrode 115 is located on the base film 100, and the touch pad electrode 155 is exposed from the first surface (the upper surface) of the buffer layer 160, with the result that a step, or height difference, as shown in FIG. 5B is formed therebetween. Consequently, the flexible printed circuit 200 may be connected to the touch pad electrode 155 and the TFT pad electrode 115 at two steps.

Figure 6A:
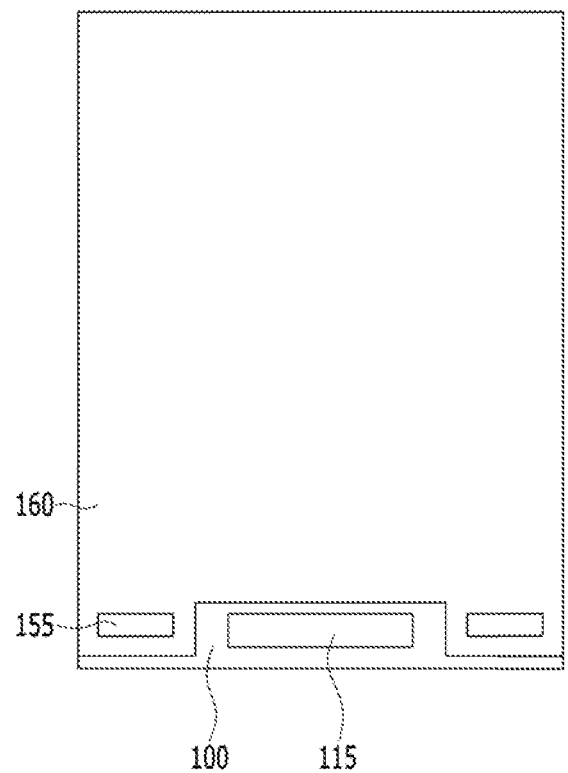
FIGS. 6A and 6B are plan views showing a touch pad electrode and a TFT pad electrode in a second exemplary embodiment of the flexible display according to the present invention.
Figure 6B:
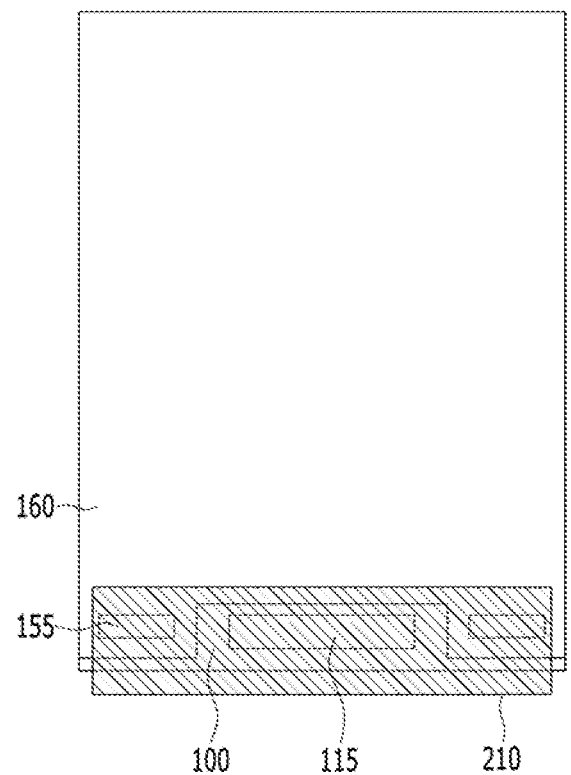

FIGS. 6A and 6B are plan views showing a touch pad electrode and a TFT pad electrode in a second exemplary embodiment of the flexible display.

In the second embodiment of the flexible display, the size of the buffer layer 160 is almost equal to the size of the base film 100. However, the TFT pad electrode 115 is exposed from the buffer layer 160 for connection with a flexible printed circuit 210. In this case, in the same manner as in the first embodiment, which was previously described, the flexible printed circuit 210 is connected to the touch pad electrodes 155 and the TFT pad electrode 115 while covering both the touch pad electrode 155 and the TFT pad electrode 115.

The present invention is not limited to the previously described first and second embodiments. The connection between the flexible printed circuit and the pad electrodes may be changed without increasing the thicknesses of the flexible printed circuit and the pad electrodes or the area of the flexible printed circuit.

Figure 7A:
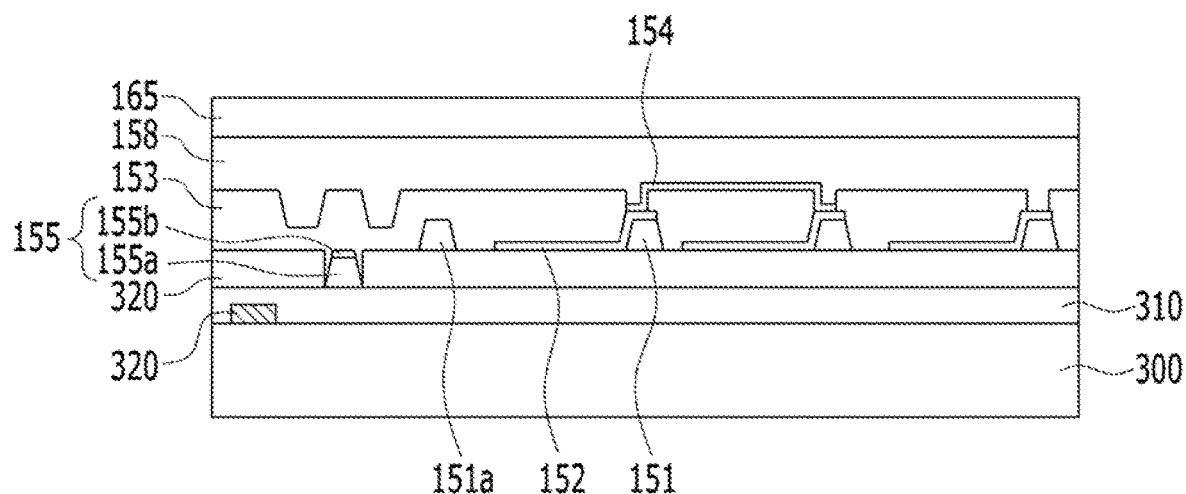
FIGS. 7A and 7B are sectional views showing a glass removal process on the touch electrode array side.
Figure 7B:
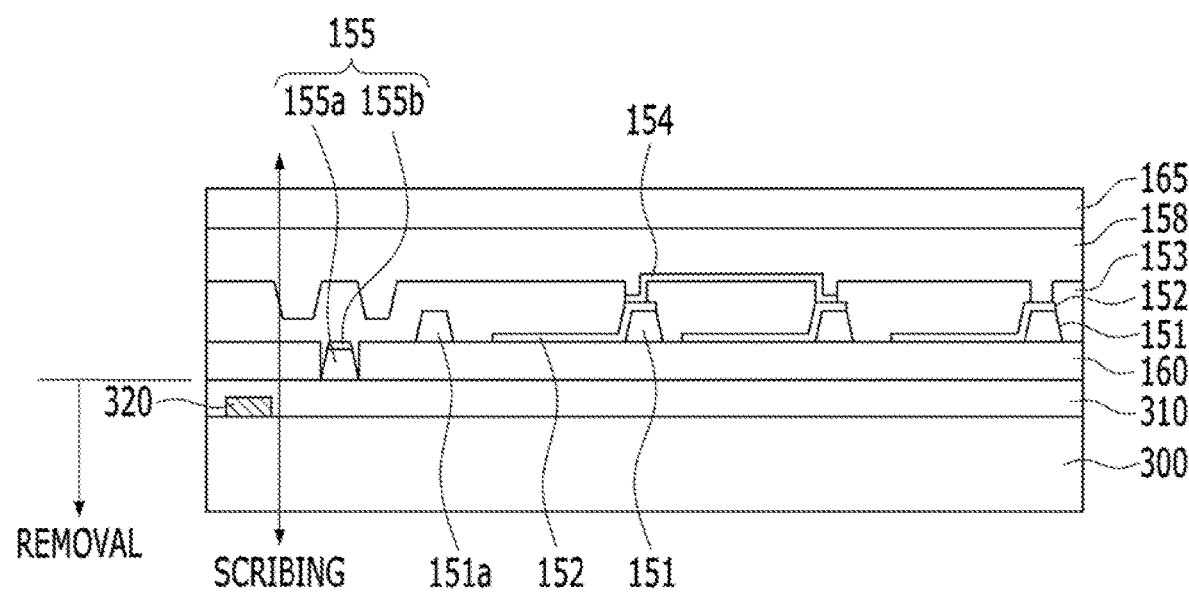

FIGS. 7A and 7B are sectional views showing a glass removal process on the touch electrode array side.

As shown in FIG. 7A, the touch pad electrode array 155 is formed on a glass substrate 300 in order to stably perform the process of forming the touch electrode array 150. In addition, a sacrificial layer 310 is further formed on the glass substrate 300 in order to protect the buffer layer 160 when the glass substrate 300 is removed by laser ablation or other means. The sacrificial layer 310 is formed before the buffer layer 160 is formed. Also, a metal shielding layer 320 is formed on the edge of the glass substrate 300.

After forming the touch pad electrode array 155, glass removing and scribing processes are followed. In some cases, scribing process may be firstly processed and then glass removing is then processed, and in another case, the steps may be reversed, and in the other case, glass removing and scribing may be simultaneously processed. As shown in FIG. 7B, the metal shielding layer 320 delineates a boundary of the glass substrate 300 in the scribing process to define a unit cell of the flexible diplay. In the scribing process, the metal shielding layer 320 divides a removed region and a remaining region. Also, in the process of glass removing, the glass substrate 300 is easily separated from the buffer layer 160 due to the metal shielding layer 320. Because the metal shielding layer 320 can be a separator between the glass substrate 300 and other members while removing the glass substrate the buffer layer In the scribing process and glass removing process, the metal shielding layer 320 is removed together with the sacrificial layer 310 that covers the metal shielding layer 320.

Hereinafter, the structure of the flexible display according to the present invention will be described in detail.

Figure 8:
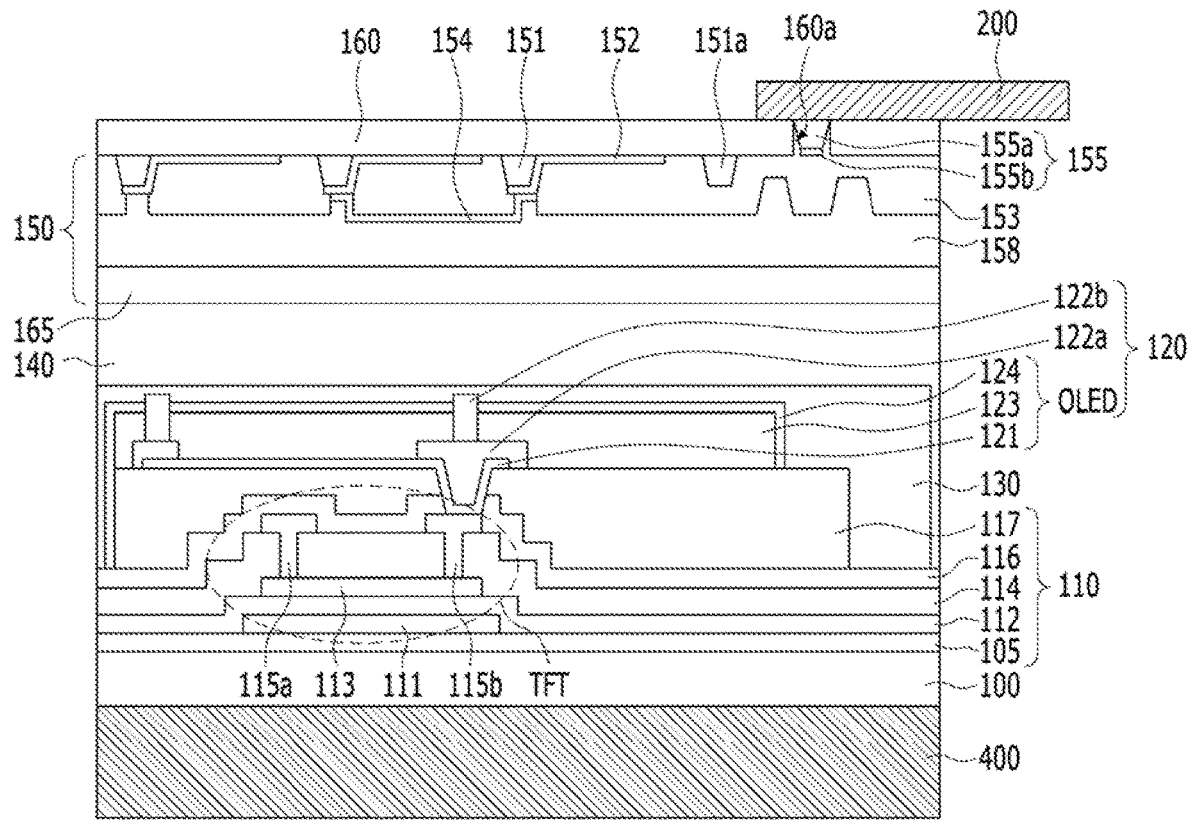
FIG. 8 is a sectional view showing the flexible display according to the disclosed embodiments.

FIG. 8 is a sectional view showing the flexible display according to the present invention.

Specifically, FIG. 8 shows the structure of the flexible display after the organic light emitting display unit and the touch electrode array are laminated together. In FIG. 8, the connection between the flexible printed circuit 200 and the touch pad electrodes 155 is shown. In some cases, as shown in FIGS. 5A and 5B, the flexible printed circuit 200 can be extended at a lower direction, and then be connected to the TFT pad electrodes 115 in the extended portion.

In comparison between the schematic sectional view of FIG. 2 and the sectional view of FIG. 8, a back cover film 400 is further provided at the lower side of the base film 100. The back cover film 400 serves to protect the base film 100 and to support the base film 100. In FIG. 2, the TFT pad electrode 115 is connected to a flexible printed circuit 180 for controlling the organic light emitting display unit, separating from the flexible printed circuit 200.

FIG. 8 shows in detail the structure of the thin film transistor array 110 and the organic light emitting diode array 120.

The thin film transistor array 110, the organic light emitting diode array 120, and the touch electrode array 150 each include an active area and a peripheral area. The active areas and the peripheral areas of the thin film transistor array 110, the organic light emitting diode array 120, and the touch electrode array 150 are aligned to one another. In each active area, a plurality of pixels is provided in a planar matrix. The thin film transistor array 110 includes a gate line and a data line, which cross each other, for each pixel and at least one thin film transistor (TFT) for each pixel. The organic light emitting diode array 120 includes organic light emitting diodes OLEDs.

The thin film transistor (TFT) in each pixel of the thin film transistor array 110 includes a gate electrode 111 formed on a TFT buffer layer 105, a gate dielectric 112 formed on the TFT buffer layer 105 so as to cover the gate electrode 111, an active layer 113 overlapping the gate electrode 111, an interlayer dielectric 114 formed on the active layer 113 and the gate dielectric 112, and a source electrode 115a and a drain electrode 115b connected to opposite ends of the active layer 113 through the interlayer dielectric 114. The gate electrode 111 may be located on the same layer as the gate lines, and the source electrode 115a and the drain electrode 115b may be located on the same layer as the data lines. Not described layers 116 and 117 are an inorganic protective layer and an organic protective layer, respectively.

In the peripheral area of the thin film transistor array 110 are a pad electrode for the gate lines and the data lines and a second pad electrode for grounding second electrodes of the organic light emitting diode array 120 or applying a predetermined voltage to the second electrodes of the organic light emitting diode array 120.

The organic light emitting diode OLED in each sub-pixel of the organic light emitting diode array 120 includes a first electrode 121 connected to the drain electrode 115b, an organic light emission layer 123 formed in a bank 122a defining a light emission area, and a second electrode 124 formed so as to cover the organic light emission layer 123.

A spacer 122b is provided on the bank 122a to prevent a deposition mask from directly contacting the bank 122a during deposition of an organic light emitting material, thereby preventing collapse of the bank 122a, which defines the light emission area.

The first electrode 121 is a reflective electrode, and the second electrode 124 is a transparent electrode. When external light is incident, the light passes through the organic light emitting diode OLED and is then reflected by the first electrode 121. The incident and reflected light passes through the second electrode 124.

An encapsulation layer 130 is formed on the organic light emitting diode array 120 so as to cover the upper surface and the side surface of the organic light emitting diode OLED.

According to design considerations, a polarizing plate may be on the outer surface of the buffer layer 160 that does not overlap the flexible printed circuit 200 so as to minimize reflection of external light from reducing display contrast.

Meanwhile, the barrier layer 165 contacts the passivation film 158, which is the innermost part in the panel of the touch electrode array 150, and the adhesive layer 140 on the organic light emitting display unit.

In addition, the buffer layer 160, which is a thin organic layer, exposes the touch pad electrode 155 through the through hole 160a. Features of the metal mesh 151, touch patterns 152, routing wires 151a, and bridge pattern 154 are also shown.

The base film 100 may include at least one high molecular compound selected from a group consisting of polyester, a copolymer including polyester, polyimide, a copolymer including polyimide, an olefin-based copolymer, polyacrylic acid, a copolymer including polyacrylic acid, polystyrene, a copolymer including polystyrene, polysulfate, a copolymer including polysulfate, polycarbonate, a copolymer including polycarbonate, polyamic acid, a copolymer including polyamic acid, polyamine, a copolymer including polyamine, polyvinyl alcohol, and polyallyamine. The base film 100 may have a thickness of 5 μm to 100 μm. In an upward light emitting type structure, the base film 100 may be made of a colored material.

Hereinafter, a method of manufacturing a flexible display according to the present embodiments will be described.

FIGS. 9A to 9G are plan views showing features made from a method of manufacturing a flexible display according to the present embodiments, and FIGS. 10A to 10I are sectional views showing features made from the method of manufacturing the flexible display according to the present embodiments.

First, as shown in FIG. 8, an organic light emitting display unit, including a thin film transistor array 110, an organic light emitting diode array 120 connected to the thin film transistor array 110, and an encapsulation layer 130 formed so as to cover the organic light emitting diode array 120, is formed on a base film 100.

Figure 9A:
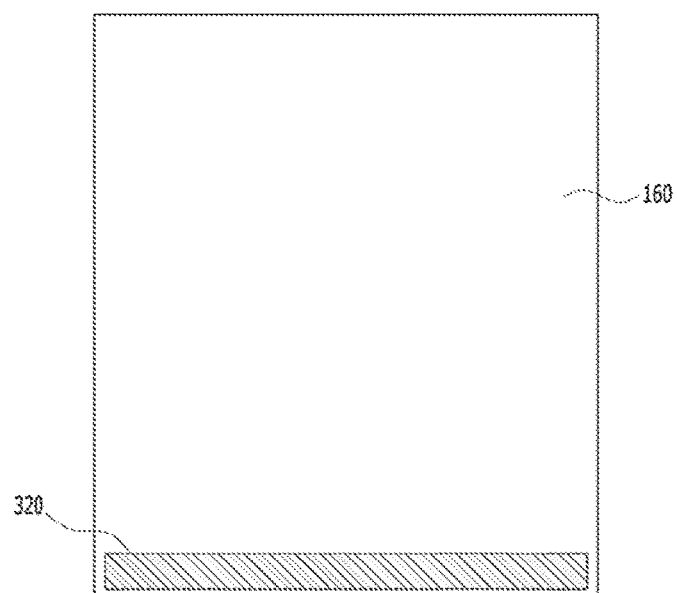
FIGS. 9A to 9G are plan views showing the results of processes in a method of manufacturing a flexible display according to the disclosed embodiments.
Figure 10A:
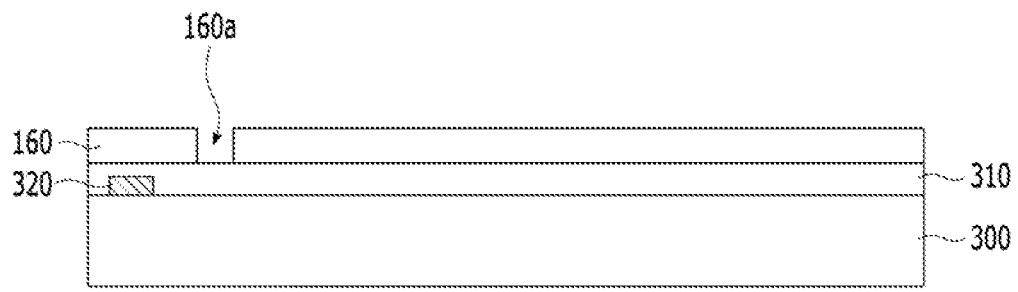
FIGS. 10A to 10I are sectional views showing the results of processes in the method of manufacturing the flexible display according to the disclosed embodiments.

Subsequently, as shown in FIGS. 9A and 10A, a metal shielding layer 320, a sacrificial layer 310, and a buffer layer 160 are formed on a glass substrate 300 (see also FIG. 7A), and then a through hole 160a is patterned through a portion of the buffer layer 160.

Figure 9B:
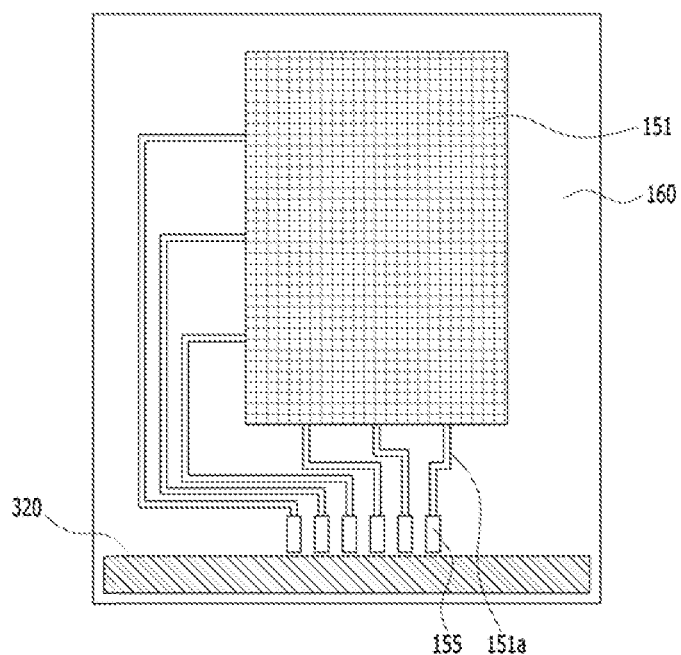
Figure 10B:
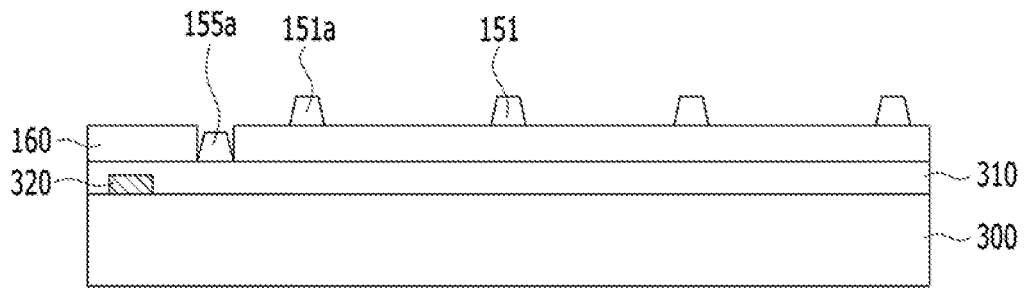

Subsequently, as shown in FIGS. 9B and 10B, a touch pad metal electrode 155a is formed in the through hole 160a, and a metal mesh layer 151 is formed on the second surface of the buffer layer 160 in the same process. The metal mesh layer 151 is made of shielding metal, such as molybdenum, exhibiting high conductivity. While the metal mesh layer 151 is formed, routing wires 151a, which are located at corresponding ends of touch patterns 152, which will be formed after the formation of the metal mesh layer 151, are also formed.

Figure 9C:
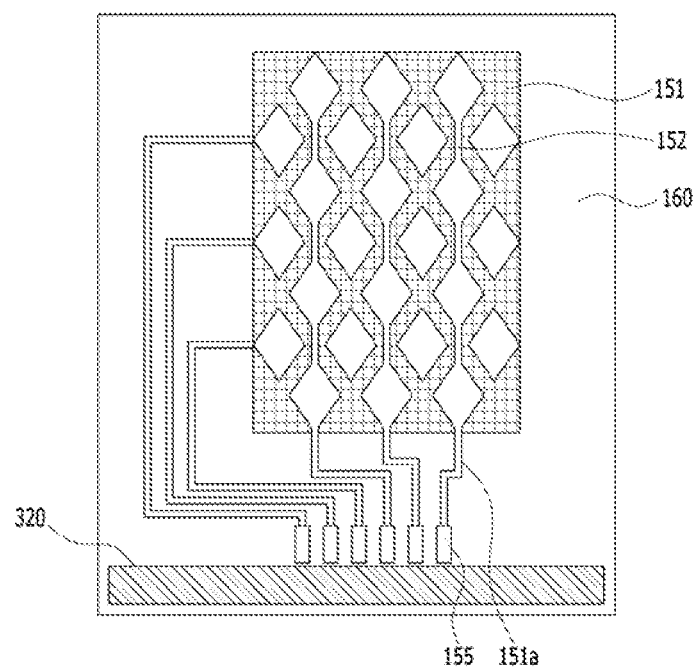
Figure 10C:
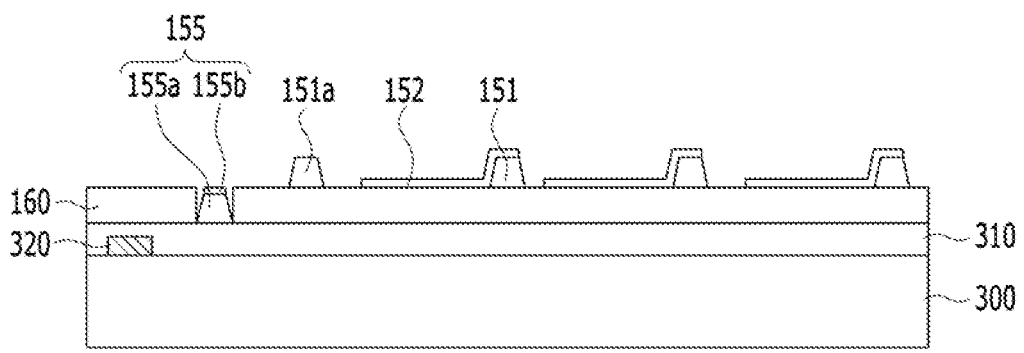

Subsequently, as shown in FIGS. 9C and 10C, a plurality of touch patterns 152, made of a transparent electrode material, are formed so as to be connected to the metal mesh layer 151. The touch patterns 152 may be patterns that are connected to one another in one direction and are spaced apart from one another in a direction perpendicular to the one direction. The spaced patterns may have a diamond shape. In this case, the metal mesh layer 151 is connected to the lower sides of the touch patterns 152, which are made of a transparent electrode material, such as indium tin oxide (ITO), to reduce the resistance of the touch patterns 152.

While the touch patterns 152 are formed, a touch pad transparent electrode 155b is formed on the touch pad metal electrode 155a, such that the touch pad metal electrode 155a and the touch pad transparent electrode 155b are stacked to constitute a touch pad electrode 155.

Figure 9D:
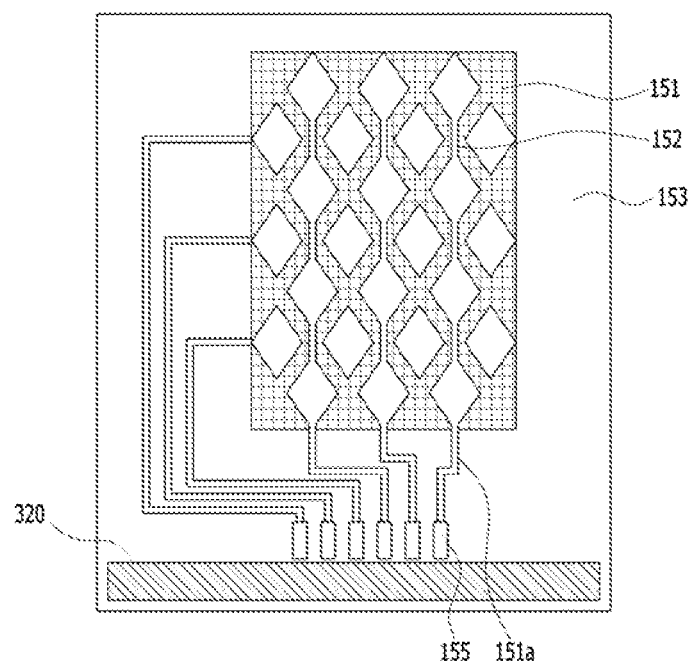
Figure 10D:
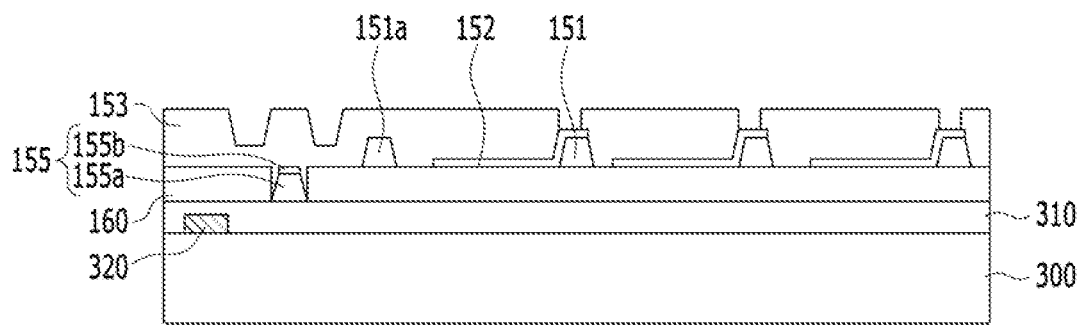

Subsequently, as shown in FIGS. 9D and 10D, an interlayer dielectric 153 is formed so as to cover the touch patterns 152 while partially exposing the touch patterns 152 on the metal mesh layer 151.

Figure 9E:
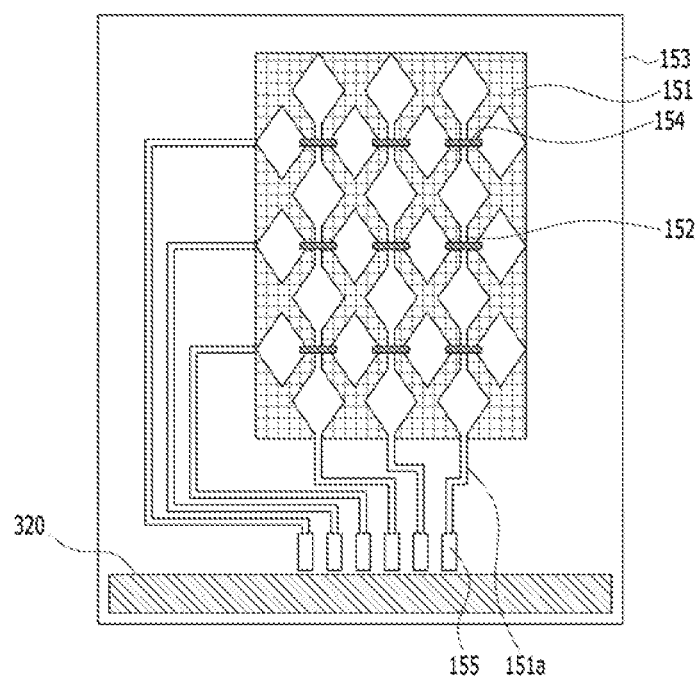
Figure 10E:
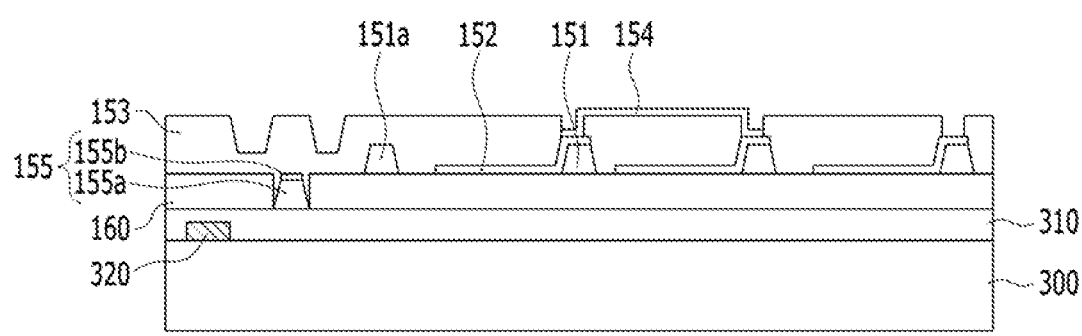

Subsequently, as shown in FIGS. 9E and 10E, a bridge pattern 154 is formed on the interlayer dielectric 153 between ones of the touch patterns that are adjacent to each other in a first direction.

Figure 9F:
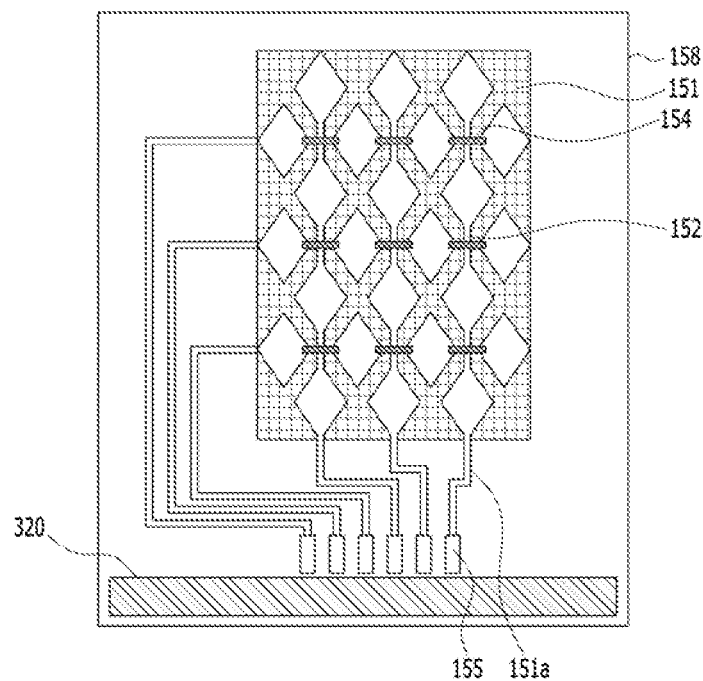
Figure 10F:
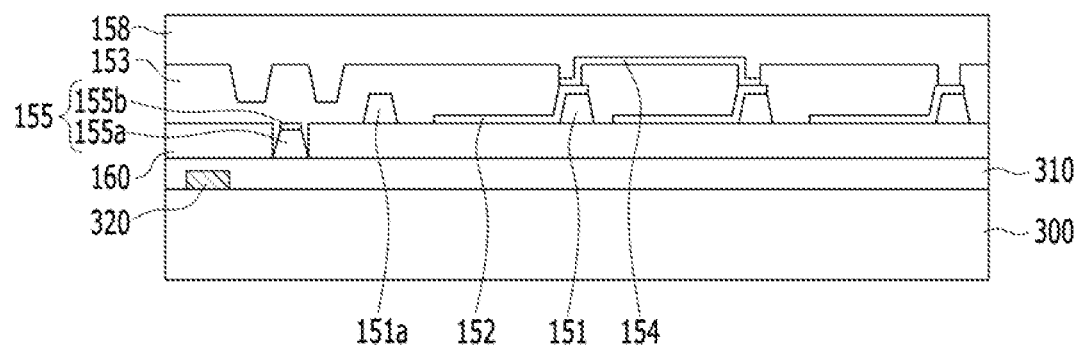

Subsequently, as shown in FIGS. 9F and 10F, a passivation film 158 is formed so as to cover the bridge pattern 154.

Figure 9G:
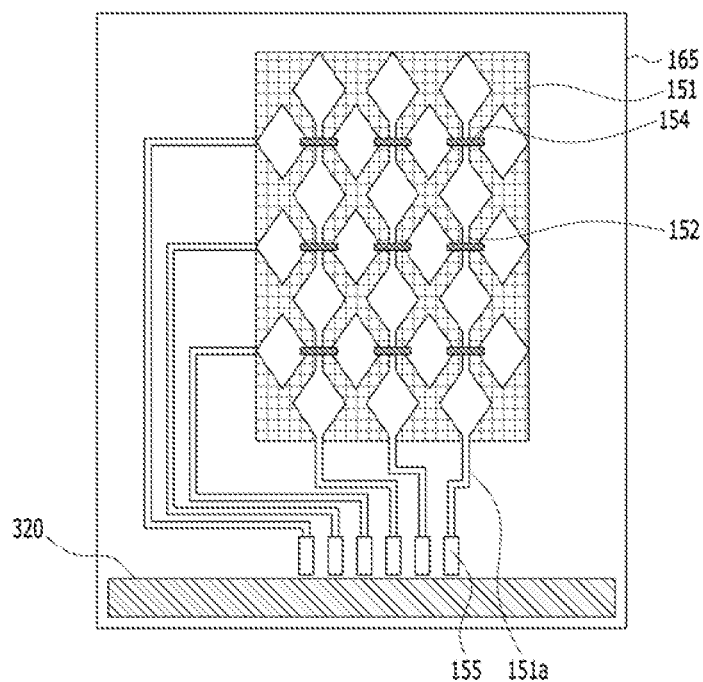
Figure 10G:
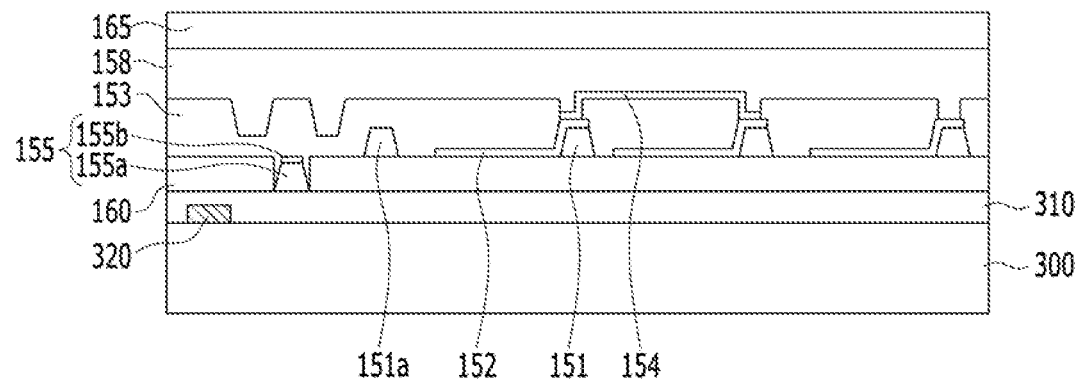

Subsequently, as shown in FIGS. 9G and 10G, a barrier layer 165 is formed on the passivation film 158.

Figure 10H:
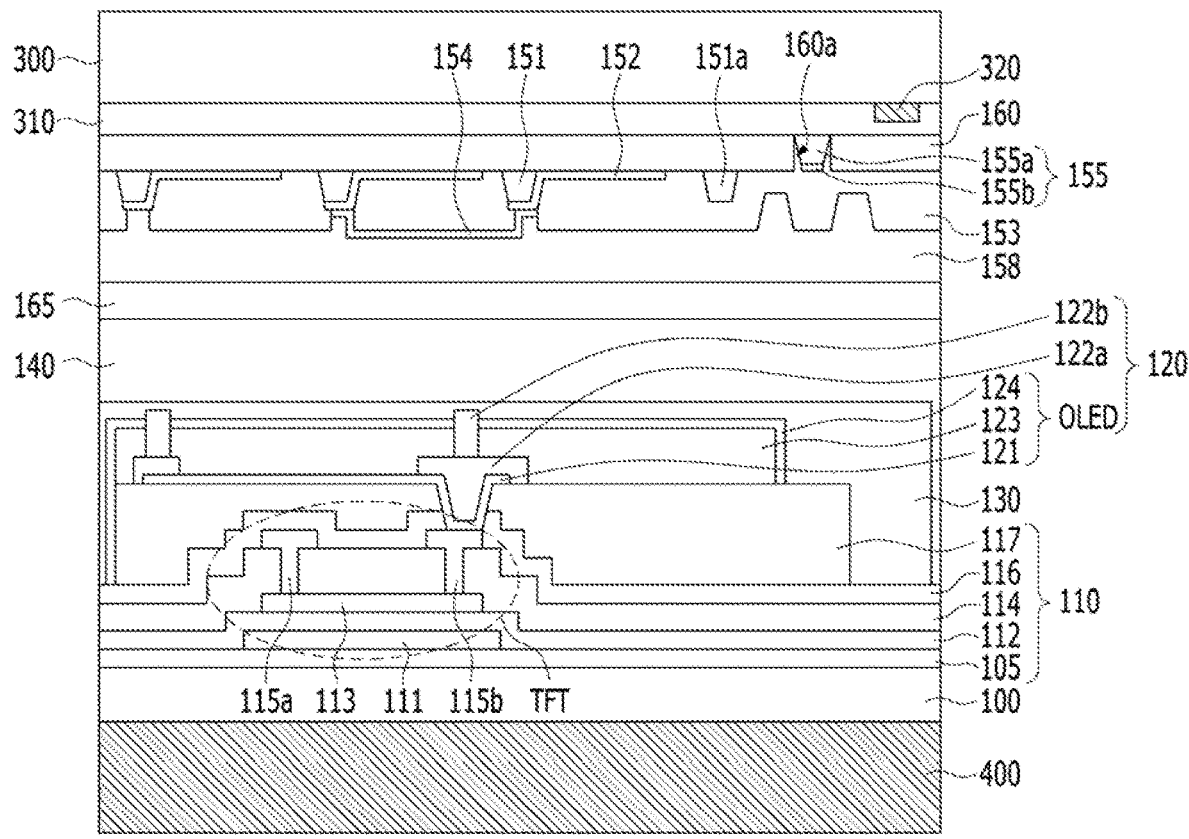

Subsequently, as shown in FIG. 10H, the organic light emitting display unit and the touch electrode array are laminated in a state in which an adhesive layer 140 is therebetween.

Figure 10I:
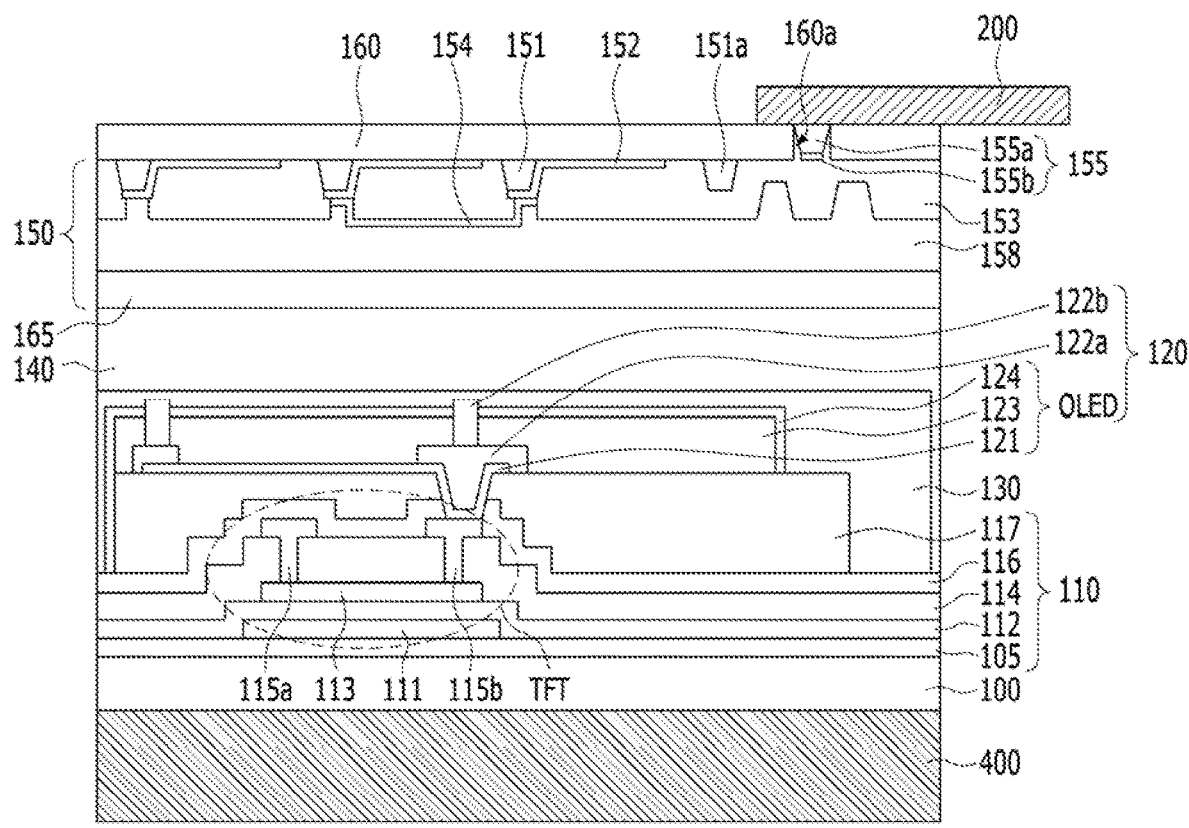

Subsequently, as shown in FIG. 10I, the glass substrate 300 and the sacrificial layer 310 are removed so as to expose the touch pad electrode 155 while glass removing and scribing process. In some cases, the sacrificial layer 310 may be omitted.

Subsequently, a flexible printed circuit 200 may be connected to the exposed touch pad electrode 155, since the touch pad electrode 155 is exposed in the through the through hole 160a, and the touch pad electrode 155 can be directly contact to the flexible printed circuit 200 with a conductive adhesive (not shown).

In addition, as previously described with reference to FIG. 8, a back cover film 400, which is thicker and harder than the base film 100, may be further attached to the lower side of the base film 100 in order to protect the bottom surface of the base film 100 after the lamination process is completed.

In the method of manufacturing the flexible display according to the present invention as described above, the touch pad electrode is exposed on the uppermost side such that the touch pad electrode is directly connected to the flexible printed circuit for touch driving. Consequently, a bonding process using an anisotropic conductive film or a pressurization process for rupturing a conductive ball in order to interconnect two electrodes that are spaced apart from each other is not required, whereby it is possible to connect the touch pad electrode without limitations in process.

In addition, the exposure of the touch pad electrode is achieved when the glass substrate is removed from the buffer layer. Because the touch pad electrode is formed in the through hole in the buffer layer, it is easy to directly connect the touch pad electrode to the flexible printed circuit.

Furthermore, the touch pad electrode is stably connected to the flexible printed circuit, thereby improving yield and reducing the amount of equipment that is required.

As is apparent from the above description, the flexible display according to the present invention and the method of manufacturing the same have the following effects.

First, the touch pad electrode is exposed on the uppermost side such that the touch pad electrode is directly connected to the flexible printed circuit for touch driving. Consequently, a bonding process is locally processed on the touch pad electrodes. Therefore, it is possible to connect the touch pad electrode without limitations in process. On the contrary, in the related art, a bonding process or a pressurization process is processed on entire surfaces of a substrate or a base film in order to interconnect two electrodes between two opposing substrates or base films that are spaced apart from each other, such large size scale processes can now be omitted.

Second, the exposure of the touch pad electrode is achieved when the glass substrate is removed from the buffer layer. Because the touch pad electrode has a shape corresponding to that of the through hole in the buffer layer, it is easy to directly connect the touch pad electrode to the flexible printed circuit.

Third, the touch pad electrode is stably connected to the flexible printed circuit, thereby improving yield and reducing the amount of equipment that is required.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A flexible display device comprising:
   an organic light emitting display unit;

an adhesive layer on the organic light emitting display unit;
a touch electrode array on the adhesive layer;
a buffer layer on the touch electrode array, wherein the buffer layer has one surface in contact with the touch electrode array, an other surface which is not in contact with the touch electrode array, and a through hole penetrating the buffer layer from the one surface to the other surface;
a touch pad electrode in the through hole penetrating the buffer layer; and
a flexible printed circuit contacting the touch pad electrode,
wherein the flexible printed circuit contacts the other surface of the buffer layer and the touch pad electrode at a plane of the other surface of the buffer layer,
wherein the touch electrode array comprises a metal mesh layer and a plurality of touch patterns in contact with the metal mesh layer on the one surface of the buffer layer, and the touch pad electrode comprises a touch pad electrode metal layer and a transparent electrode metal layer stacked in the through hole, and
wherein the metal mesh layer and the touch pad electrode metal layer are formed of the same metal, and the touch patterns and the transparent electrode metal layer are formed of a same transparent metal.

2. The flexible display according to claim 1, wherein the flexible printed circuit flatly contacts a surface of the touch pad electrode where the touch electrode array is not positioned and the other surface of the buffer layer, wherein the surface of the touch pad electrode and the other surface of the buffer layer are coplanar.

3. The flexible display device of claim 1, further comprising a barrier layer between the adhesive layer and the touch electrode array.

4. The flexible display device of claim 1, wherein the touch electrode array further comprises:
routing wires on the one surface of the buffer layer;
an interlayer dielectric over the plurality of touch patterns and exposing a portion of each of the touch patterns;
a bridge pattern on the interlayer dielectric; and
a passivation layer covering the bridge pattern.

5. The flexible display device of claim 1, wherein the organic light emitting display unit comprises a thin film transistor array, an organic light emitting diode array connected to the thin film transistor array, and an encapsulation layer to cover the organic light emitting diode array on a base film.

6. The flexible display device of claim 5, wherein the base film protrudes from the buffer layer, a thin film transistor pad electrode is on the base film at a protruded portion of the base film from the buffer layer, and the flexible printed circuit is connected to the thin film transistor pad electrode.

7. The flexible display device of claim 5, further comprising a back cover film on an outer surface of the base film.

8. The flexible display according to claim 1, wherein the buffer layer is an organic layer having a thickness of 0.1 µm to 8 µm.

9. A flexible display device including a touch electrode array and the touch electrode array comprising:
a buffer layer including a through hole penetrating the buffer layer from an inner surface to the outer surface;
a touch pad electrode in the through hole of the buffer layer;
a metal mesh and routing wires on the inner surface of the buffer layer;
a plurality of touch patterns on the buffer layer and contacting the metal mesh; and
a flexible printed circuit contacting the touch pad metal electrode at a plane which does not include the metal mesh, the routing wires and the plurality of touch patterns, wherein the flexible printed circuit flatly contacts the touch pad metal electrode and the outer surface of the buffer layer,
wherein the touch electrode array comprises the metal mesh and the plurality of touch patterns on the buffer layer, and
wherein the touch pad electrode comprises the touch pad electrode metal layer and the transparent electrode metal layer stacked in the through hole, and
wherein the metal mesh and the touch pad electrode metal layer are formed of the same metal, and the touch patterns and the transparent electrode metal layer are formed of a same transparent metal.

10. A method of manufacturing a flexible display device, comprising:
providing a glass substrate;
forming a buffer layer on the glass substrate;
patterning a through hole in the buffer layer;
forming a touch pad electrode in the through hole and a touch electrode array on the buffer layer, simultaneously;
providing an organic light emitting display unit;
laminating the organic light emitting display unit and the touch electrode array in a state in which an adhesive layer is disposed therebetween;
removing the glass substrate to expose the touch pad electrode on a first surface of the buffer layer; and
connecting a flexible printed circuit to the exposed touch pad electrode,
wherein the step of forming the touch electrode array and the touch pad electrode comprises:
forming a touch pad electrode metal layer in the through hole and a metal mesh layer on the buffer layer, with a same metal;
forming a plurality of touch patterns connected to the metal mesh layer and forming a transparent electrode metal layer on the touch pad electrode metal layer, with a same transparent metal, so that a touch pad electrode comprises the touch pad electrode metal layer and the transparent electrode metal layer stacked in the through hole, and the touch electrode array comprises the metal mesh layer and the touch patterns on the buffer layer.

11. The method according to claim 10, further comprising forming a barrier layer on a surface of the touch electrode array.

12. The method according to claim 10, further comprising forming a sacrificial layer between the glass substrate and the buffer layer.

13. The method according to claim 12, wherein the step of forming the sacrificial layer comprises partially removing a portion of a peripheral area of the sacrificial layer that does not overlap the touch electrode array and the touch pad electrode and forming a metal shielding pattern in the removed area of the sacrificial layer.

14. The method according to claim 13, wherein the metal shielding pattern is also removed during the step of removing the glass substrate.

15. The method according to claim 12, wherein the sacrificial layer is also removed during the step of removing the glass substrate.

16. The method according to claim 10, wherein the step of forming the touch electrode array and the touch pad electrode further comprises:
  forming an interlayer dielectric to cover the touch patterns while partially exposing the touch patterns on the metal mesh layer;
  forming a bridge pattern on the interlayer dielectric between ones of the touch patterns adjacent to each other in a first direction; and
  forming a passivation film to cover the bridge pattern.

17. The method according to claim 10, wherein the flexible printed circuit flatly contacts on a surface of the touch pad electrode and the first surface of the buffer layer.

18. The method of claim 10, wherein the step of providing an organic light emitting display unit comprises forming a thin film transistor array and a thin-film transistor pad on a base film, forming an organic light emitting diode array connected to the thin film transistor array, and forming an encapsulation layer to cover the organic light emitting diode array.

19. The method of claim 18, further comprising contacting to the flexible printed circuit on the thin-film transistor pad of the base film.

* * * * *